(12) United States Patent
Zhang et al.

(10) Patent No.: US 9,984,760 B1
(45) Date of Patent: May 29, 2018

(54) SUPPRESSING DISTURB OF SELECT GATE TRANSISTORS DURING ERASE IN MEMORY

(71) Applicant: SanDisk Technologies LLC, Plano, TX (US)

(72) Inventors: Zhengyi Zhang, Mountain View, CA (US); Liang Pang, Fremont, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days. days.

(21) Appl. No.: 15/403,710

(22) Filed: Jan. 11, 2017

(51) Int. Cl.
*G11C 16/28* (2006.01)
*G11C 16/34* (2006.01)
*G11C 16/04* (2006.01)
*G11C 16/10* (2006.01)
*G11C 16/16* (2006.01)

(52) U.S. Cl.
CPC ...... *G11C 16/3431* (2013.01); *G11C 16/0483* (2013.01); *G11C 16/10* (2013.01); *G11C 16/16* (2013.01); *G11C 16/28* (2013.01); *G11C 16/3445* (2013.01); *G11C 16/3459* (2013.01)

(58) Field of Classification Search
CPC .................. G11C 16/3418; G11C 16/0483
USPC .................................. 365/185.02, 185.29
See application file for complete search history.

(56) References Cited

U.S. PATENT DOCUMENTS

| | | | |
|---|---|---|---|
| 8,004,900 B2 | 8/2011 | Dutta et al. | |
| 8,009,474 B2 * | 8/2011 | Nishihara | G11C 16/0483 365/185.09 |
| 9,136,005 B2 | 9/2015 | Choe et al. | |
| 9,208,883 B2 | 12/2015 | Alsmeier | |
| 2013/0314995 A1 | 11/2013 | Dutta et al. | |
| 2014/0119121 A1 | 5/2014 | Aritome | |
| 2014/0192584 A1 * | 7/2014 | Aritome | G11C 5/063 365/72 |

(Continued)

FOREIGN PATENT DOCUMENTS

| | | |
|---|---|---|
| WO | WO2015/050787 A1 | 4/2015 |
| WO | WO2016/028459 A1 | 2/2016 |

OTHER PUBLICATIONS

International Search Report & the Written Opinion of the International Searching Authority dated Feb. 7, 2018, International Application No. PCT/US2017/063414.

*Primary Examiner* — Hoai V Ho
*Assistant Examiner* — Minh Dinh
(74) *Attorney, Agent, or Firm* — Vierra Magen Marcus LLP

(57) ABSTRACT

A memory device and associated techniques avoid a disturb of a select gate transistor during an erase operation for memory cells in a string. During the erase operation, a channel of the string is charged up from a source end of the string. However, there is a delay in charging up a drain end of the channel. A voltage detector connected to a bit line detects when a drain end of the channel reaches a reference voltage. When the reference voltage is reached, a voltage of the select gate transistor at the drain end of the string can be floated. This avoids unintentional programming of the select gate transistor which could otherwise occur if the voltage was floated to soon. Also, a substrate voltage may be ramped up to a first detected level before being ramped up to a second, final level.

20 Claims, 18 Drawing Sheets

(56) References Cited

U.S. PATENT DOCUMENTS

2015/0078097 A1* 3/2015 Yano .................. G11C 16/14
                                                                  365/185.25

\* cited by examiner

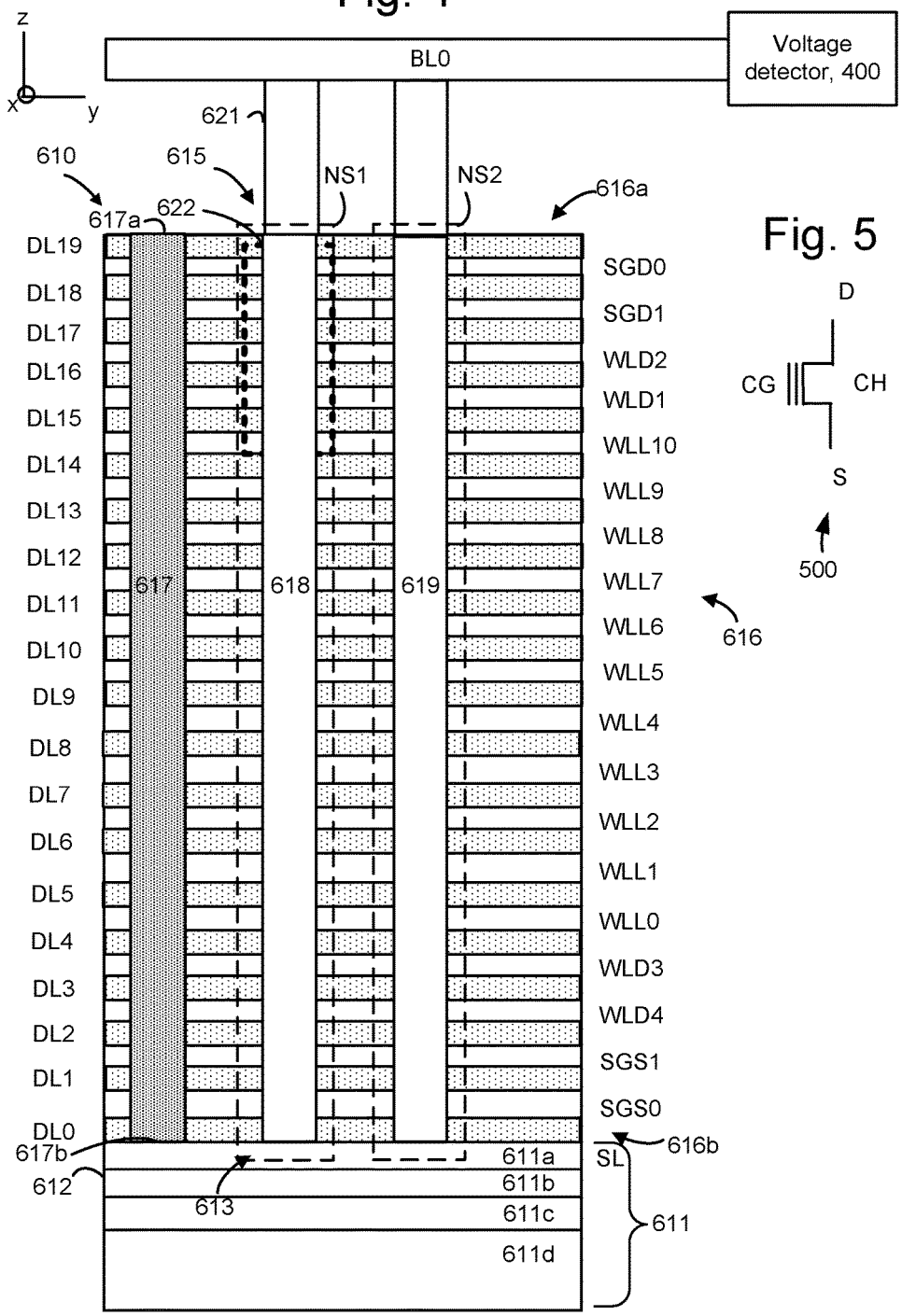

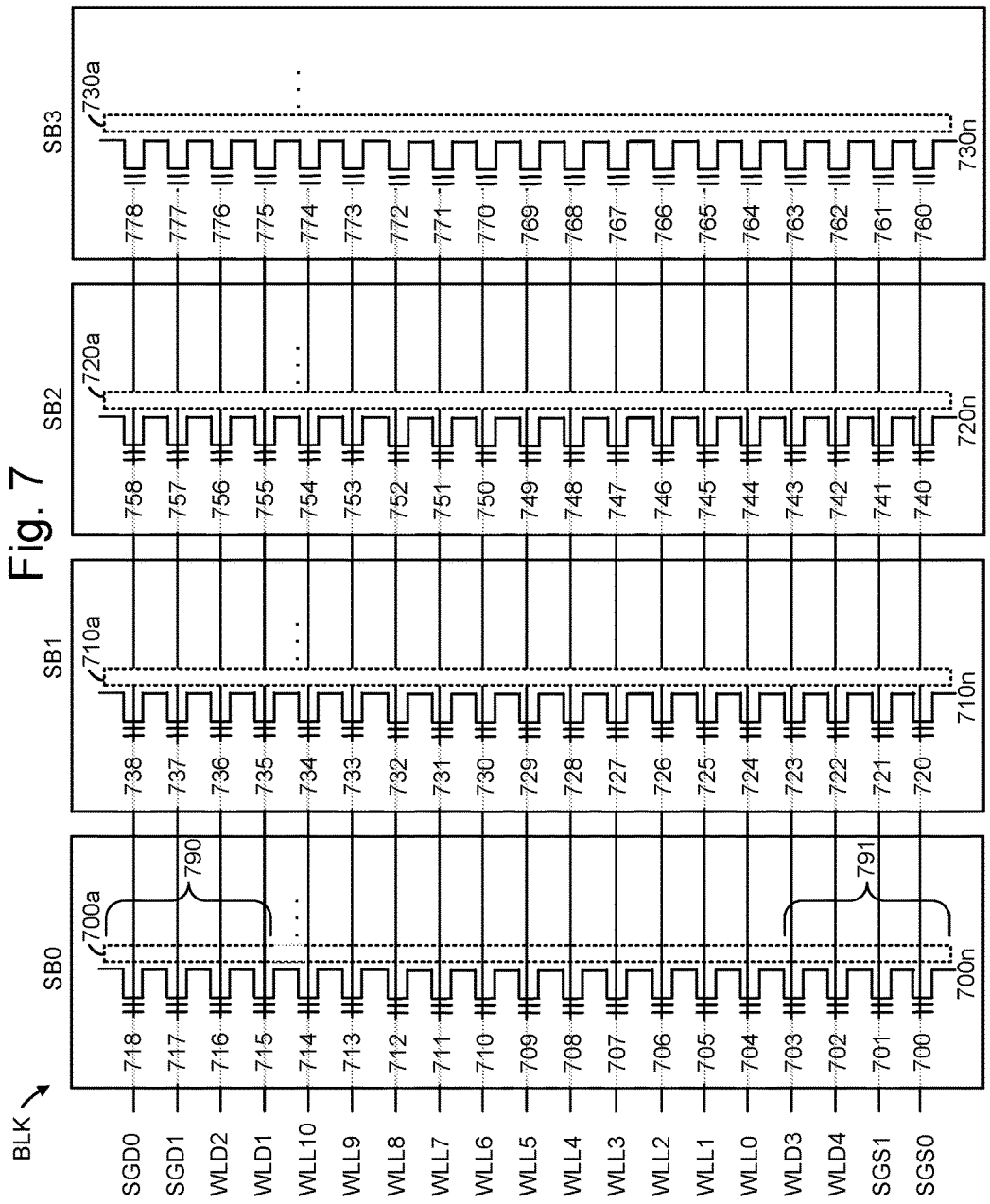

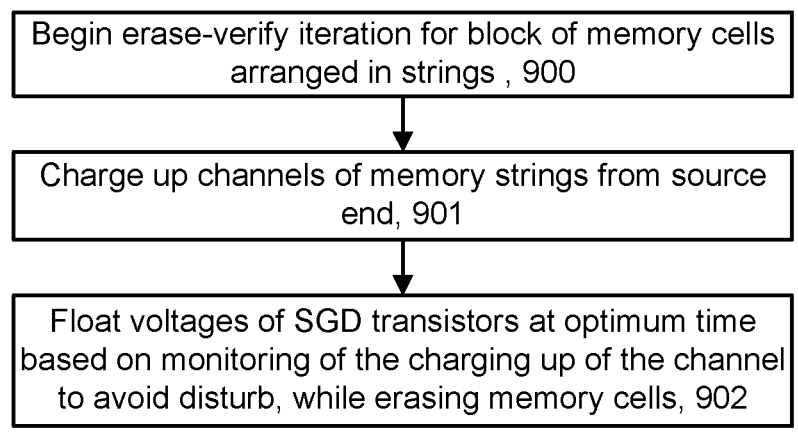

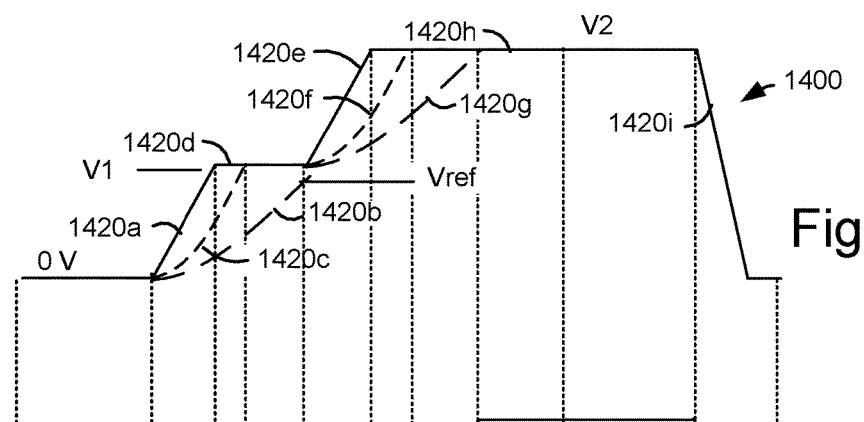
Fig. 14A
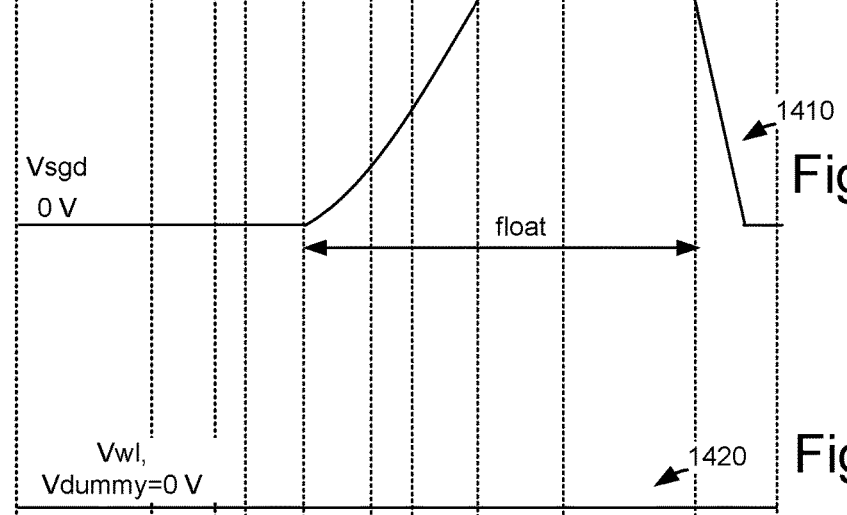
Fig. 14B
Fig. 14C
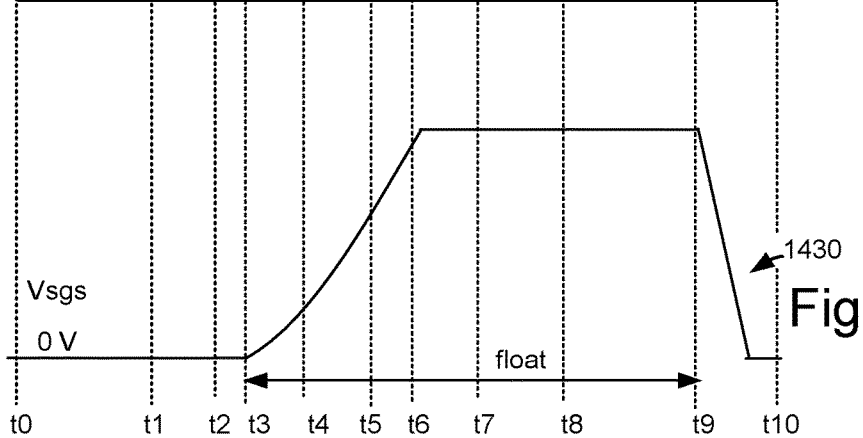
Fig. 14D

SUPPRESSING DISTURB OF SELECT GATE TRANSISTORS DURING ERASE IN MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 4 depicts an example cross-sectional view of a portion of one of the blocks of FIG. 3.

FIG. 5 depicts an example transistor 500.

FIG. 7 depicts an example view of NAND strings in sub-blocks in a 3D configuration which is consistent with FIG. 4.

FIG. 9 depicts an example process for performing an erase operation while avoiding a disturb of SGD transistors.

FIG. 14A depicts an example erase voltage waveform, also showing substrate and bit line voltages, consistent with FIG. 10.

FIG. 14B depicts an example SGD control gate voltage waveform, consistent with FIG. 14A.

FIG. 14C depicts an example data word line and dummy word line voltage waveform, consistent with FIGS. 14A and 14B.

FIG. 14D depicts an example SGS control gate voltage waveform, consistent with FIG. 14A to 14C.

DETAILED DESCRIPTION

Figure 1:
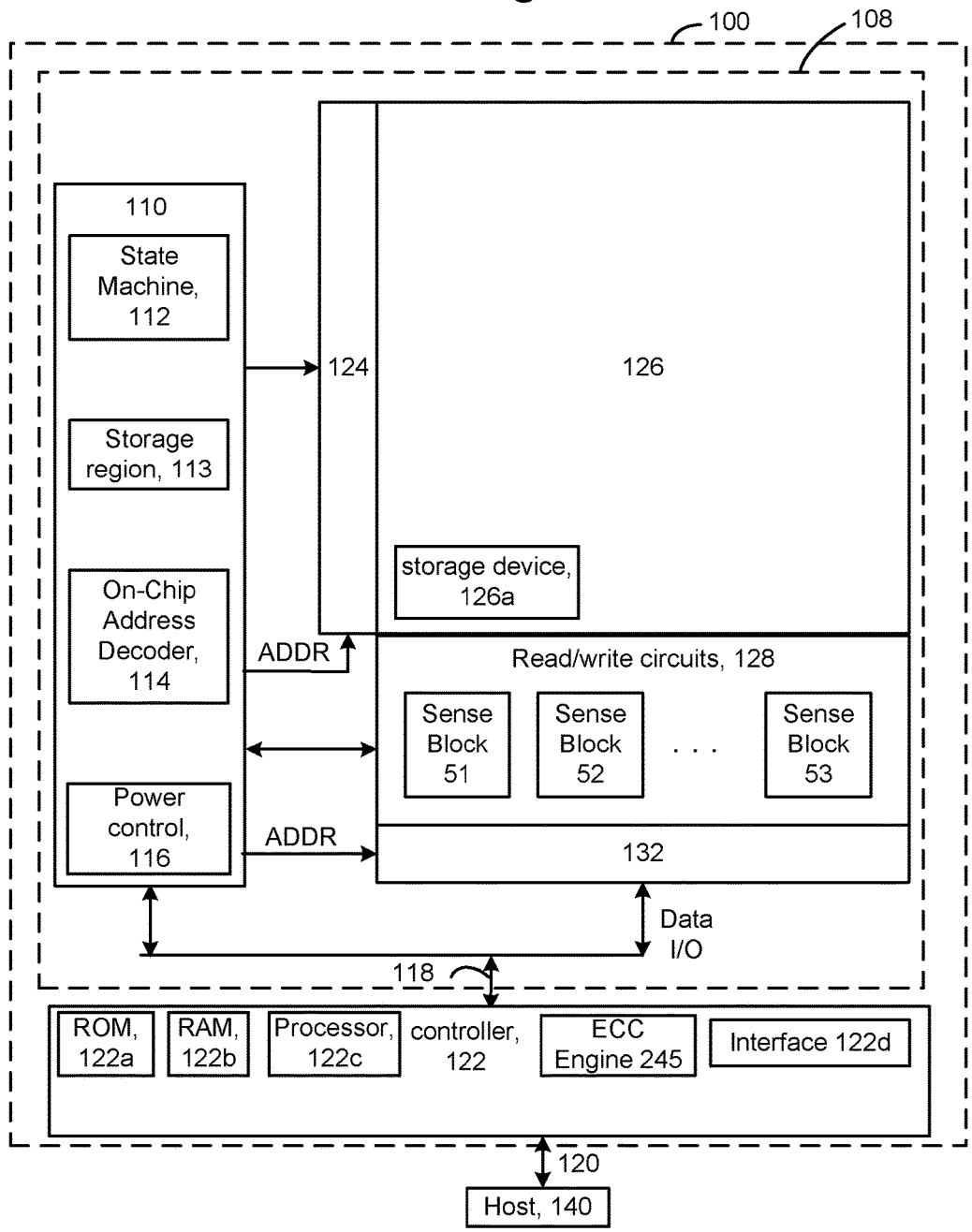
FIG. 1 is a block diagram of an example memory device.

Apparatuses and techniques are described for avoiding disturbs of select gate transistors during an erase operation for a block of memory cells.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 11A). In a three-bit per cell memory device, there are eight data states including the erased state and seven higher data states referred to as the A, B, C, D, E, F and G data states. In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

When new data is to be written to a block, the block is erased. This involves boosting the channel voltage while holding the control gates of the memory cells at a low voltage such as 0 V. Various approaches can be used to boost the channel voltage. One approach raises the voltage of a substrate at a source end of the memory strings. Additionally, the control gate voltage of a source side select gate transistor (SGS transistor) of each memory string is controlled to allow holes (positive charges) to enter the channel.

However, the boosting of the channel voltage, also referred to as charging up the channel, varies along the channel from the bottom to the top. For example, with vertical memory strings, a bottom (or source end) of the string is in contact with the substrate so it is charged up sooner than the top (or drain end) of the string. Moreover, the control gate voltage of a drain side select gate transistor (SGD transistor) of each memory string can be floated to avoid erasing these transistors. However, if the control gate voltage is floated while the channel region adjacent to the SGD transistor is only weakly charged up, and while an adjacent data or dummy memory cell is held at a low voltage such as 0 V, a significant channel gradient can be created between the SGD transistor and the adjacent memory cell.

In particular, the control gate of the SGD transistor can be coupled up due to capacitive coupling from a local interconnect which carries the erase voltage for the substrate. This results in a channel gradient which can generate electron-hole pairs in which the electrons are drawn into the charge trapping layer of the SGD transistor, raising the threshold voltage of the transistor. See FIG. 12. This is a type of disturb.

Techniques provided herein address the above and other issues. In one aspect, the control gate voltage of the SGD transistor is held at a fixed level, e.g., 0 V, until the channel region adjacent to the transistor is sufficiently charged up to allow floating of the voltage without a likelihood of a disturb. The charging up of the channel can be monitored so that an accurate determination can be made of an optimum time to begin the floating. In one approach, a voltage of the channel region adjacent to the SGD transistor is monitored using a voltage detector connected to a bit line. Due to the proximity of the channel region adjacent to the SGD transistor and the bit line, a voltage of the bit line is close to the voltage of the channel region adjacent to the SGD transistor. When the bit line voltage reaches a reference voltage, the control gate voltage of the SGD transistor is floated.

In another aspect, the erase voltage is ramped up to a first, intermediate level and held at that level until the time of the floating of the control gate voltage of the SGD transistor. At this time, the erase voltage can be ramped up further to a second, maximum level. A voltage detector may be used to determine when the substrate voltage reaches the reference voltage and trigger the temporary hold of the erase voltage. By ramping the erase voltage in to steps, where the SGD transistor is not floated during the first step, the amount of coupling to the control gate of the SGD transistor from the local interconnect is reduced.

These and other features are discussed herein.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
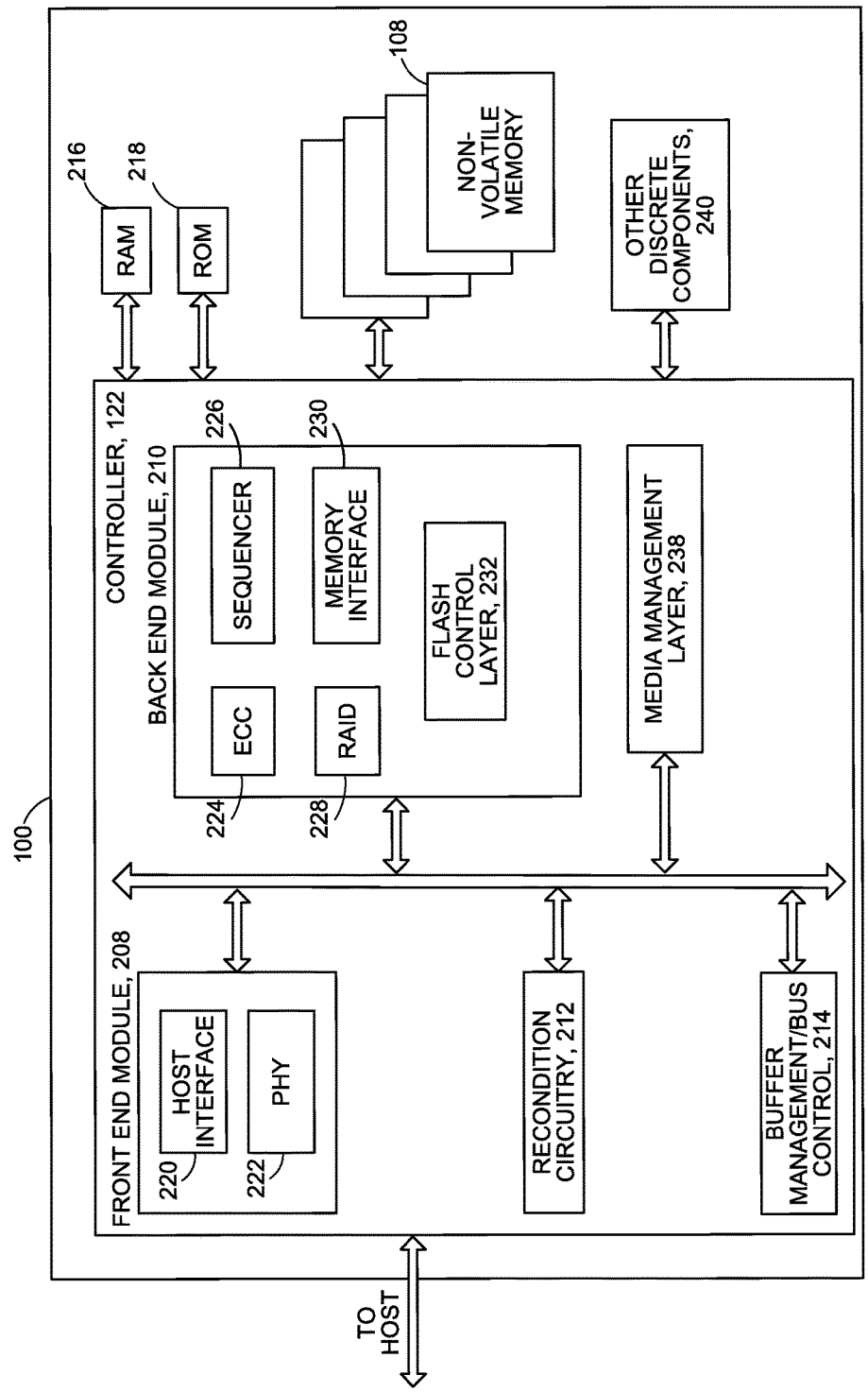
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1 (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
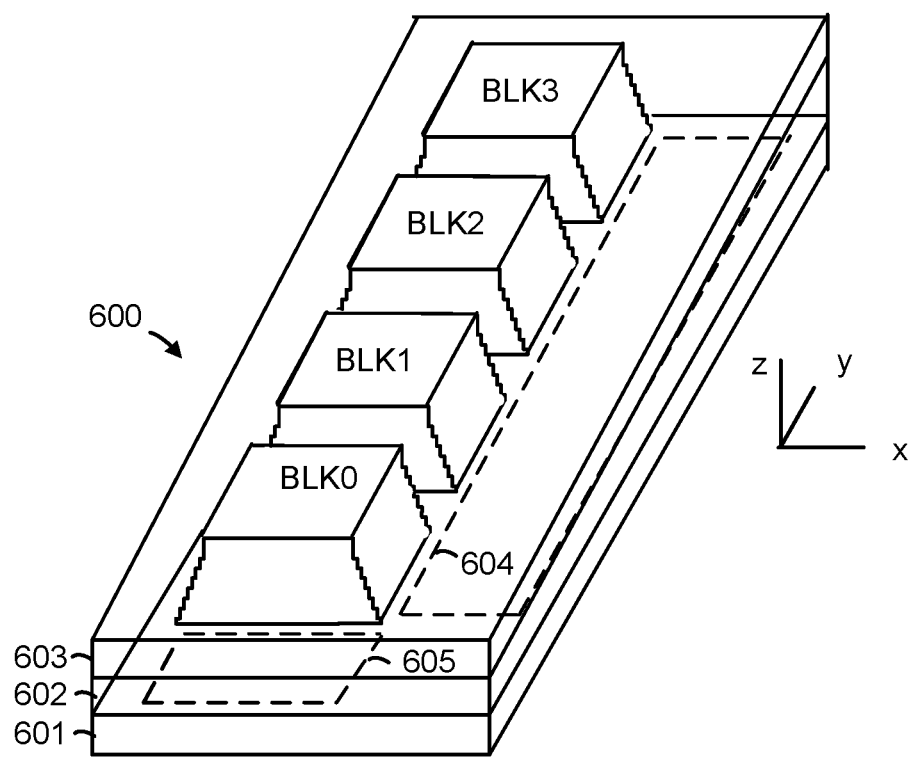
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks. Voltage detectors for bit lines may be located in this peripheral area 605, in one approach. In this case, the blocks BLK0, BLK1, BLK2 and BLK3 are at progressively further distances from the voltage detectors.

The circuitry can include voltage drivers which can be connected to control gate layers, bit lines and source lines of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Local interconnects, such as interconnect 617, may be provided periodically across the stack. The local interconnects may be metal-filled slits which extend through the stack, such as to connect the source line/substrate to a line above the stack. The slits may be used during the formation of the word lines and subsequently filled with metal. A portion of a bit line BL0 is also depicted. A conductive via connects the drain-end of each memory string to a bit line. For example, a conductive via 621 connects the drain-end 615 to BL0. The local interconnect 617 has a top 617a and a bottom 617b. The bottom is in contact with the substrate.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, the use of dummy memory cells is optional and one or more may be provided. Also, one or more SGD transistors and one or more SGS transistors may be provided in a memory string.

A voltage detector 400 is connected to the bit line. A voltage detector 784 may also be used to monitor the substrate voltage (see FIGS. 8A and 8B).

FIG. 5 depicts an example transistor 500. The transistor comprises a control gate CG, a drain D, a source S and a channel CH. During an erase operation, the transistor has a positive channel-to-control gate voltage. In the case of a memory cell transistor, the control gate voltage can be set to a low value such as 0 V so that the channel-to-control gate voltage is high enough to repel electrons from the charge trapping layer and thereby lower the Vth of the memory cell. In the case of a select gate transistor, the control gate voltage can be set to a higher value such as 10-12 V or floated so that the channel-to-control gate voltage is not high enough to lower the Vth of the transistor.

Figure 6:
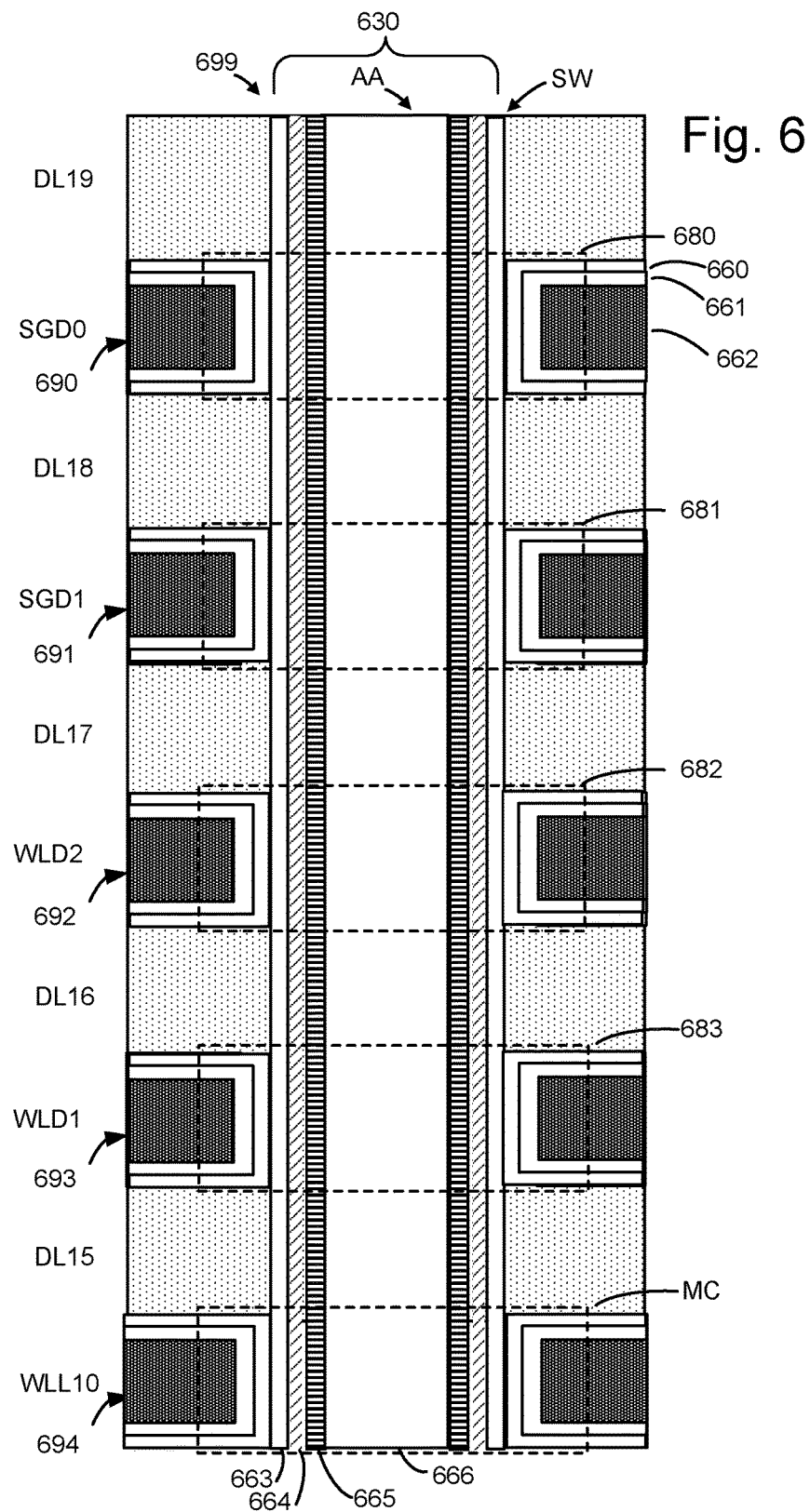
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channels 700a, 710a, 720a and 730a, respectively. Each channel has a drain end and a source end. For example, the channel 700a has a drain end 790 and a source end 791.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

Figure 8A:
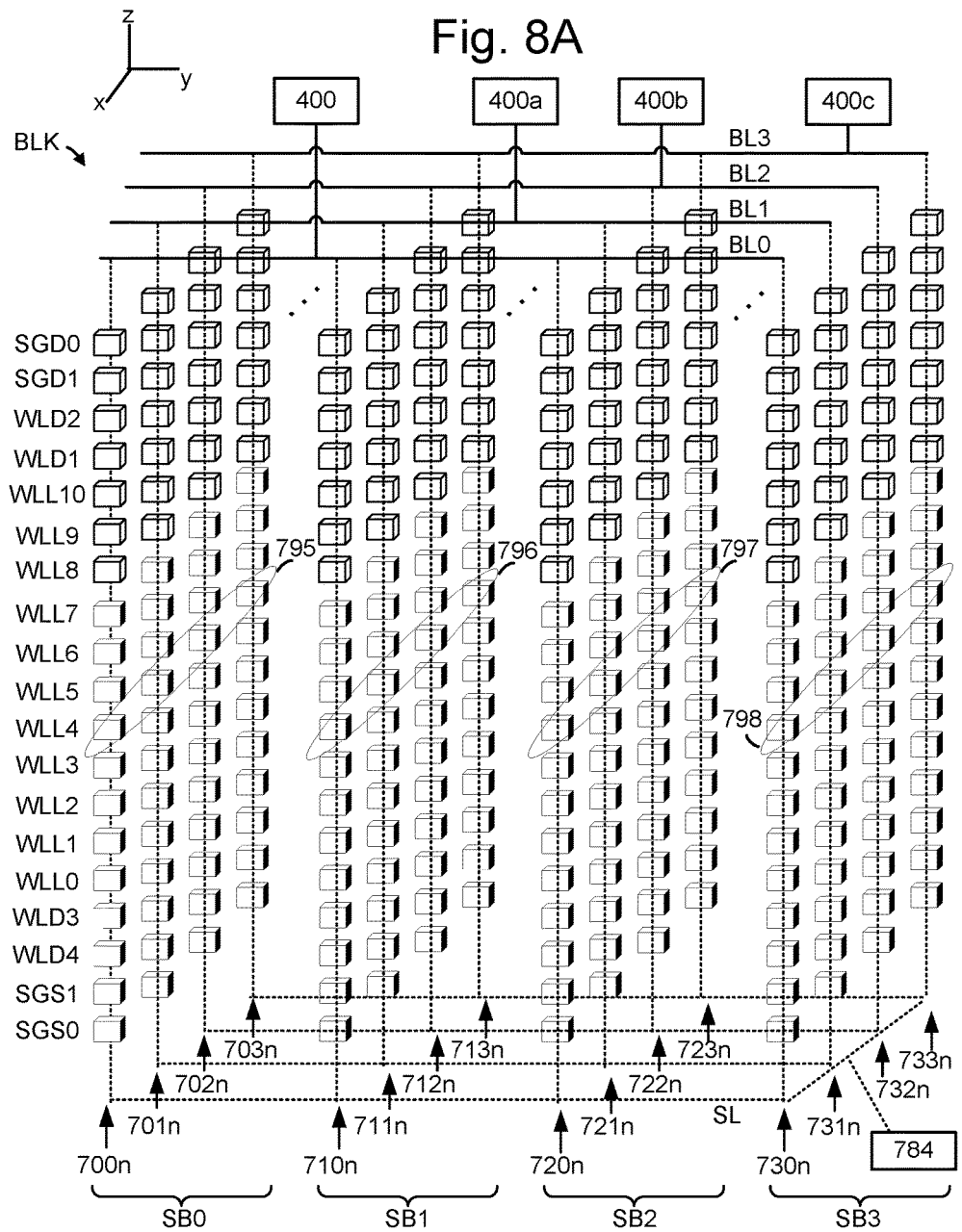
FIG. 8A depicts additional detail of the sub-blocks SB0-SB3 of FIG. 7.

FIG. 8A depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. A voltage detector may be connected to each bit line. For example, voltage detectors 400 (consistent with FIG. 4), 400a, 400b and 400c are connected to bit lines BL0, BL1, BL2 and BL3, respectively. The voltage detectors may be provided with the sensing circuitry, for example.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4. In this example, the voltage of a source line SL or source region (e.g., the substrate or a p-well in the substrate) is detected by a voltage detector 784. Generally, a voltage source is used to provide a voltage on the local interconnect. However, some time is needed for the voltage to increase to a commanded level due to the large capacitance of the p-well. A voltage detector can be connected to the local interconnect or the substrate to measure the substrate voltage.

Figure 8B:
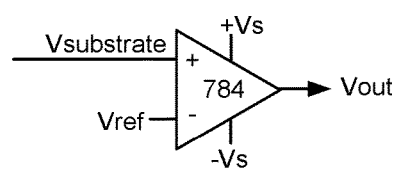
FIG. 8B depicts an example embodiment of the voltage detector 784 of FIG. 8A.

FIG. 8B depicts an example embodiment of the voltage detector 784 of FIG. 8A. The voltage detector may comprise an operational amplifier comparator, for instance. The comparator includes a non-inverting input which receives Vsubstrate, an inverting input which receives a reference voltage Vref, positive and negative power supplies +Vs and −Vs, respectively and an output which provides Vout. Vout=+Vs if Vsubstrate>Vref and Vout=−Vs if Vsubstrate<Vref. The analog output value can be provided to a controller which converts it to a 0 or 1 bit to represent Vsubstrate>Vref or Vsubstrate<Vref, respectively. If the bit=0, the controller can initiate a hold of the erase voltage at the level of V1, which is slightly higher than Vref in one approach. See FIG. 14A. If the bit=1, the controller continues to ramp up the substrate voltage.

FIG. 9 depicts an example process for performing an erase operation while avoiding a disturb of SGD transistors. Step 900 begins an erase-verify iteration for a block of memory cells arranged in strings. Step 901 includes charging up channels of the memory strings from source ends of the memory strings. Step 902 includes floating voltages of SGD transistors at an optimum time based on monitoring of the charging up of the channel to avoid disturbs, while erasing memory cells. Various approaches for identifying the optimum time are described herein.

Figure 10:
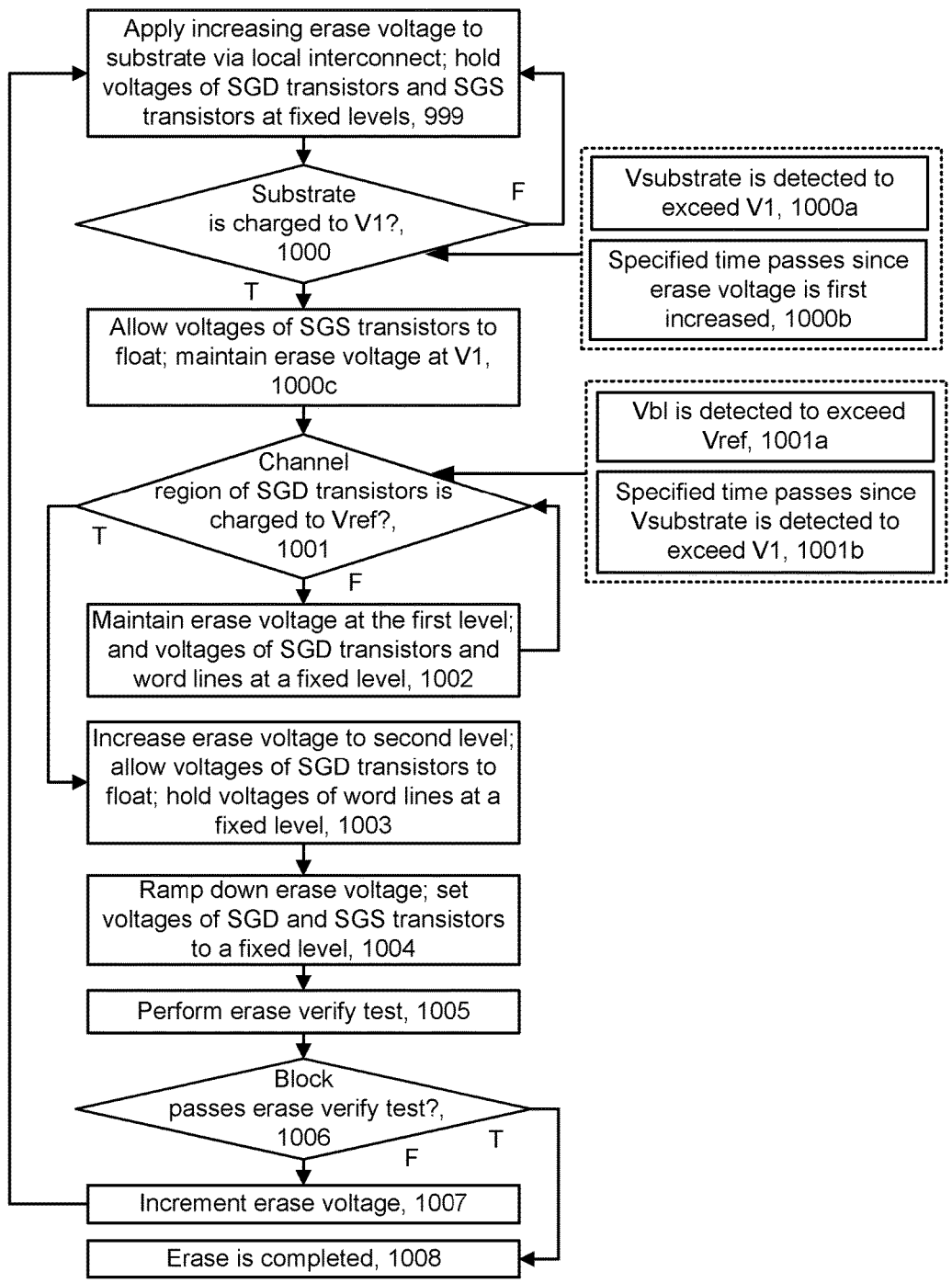
FIG. 10 depicts details of an example process for performing an erase operation consistent with FIG. 9.

FIG. 10 depicts details of an example process for performing an erase operation consistent with FIG. 9. Step 999 includes applying an increasing erase voltage to a substrate via a local interconnect, holding control gate voltages of SGD transistors, word lines (data word lines and dummy word lines) and SGS transistors at respective fixed levels, e.g., 0 V for SGD and SGS transistors and word lines. See the time period t1-t4 in FIG. 14A to 14D. A decision step 1000 determines whether the substrate is charged to a first level, V1. This decision step may be true if Vsubstrate (a substrate voltage) is detected by a voltage detector to exceed V1 (block 1000a) (t3 in FIG. 14A) or if a specified time passes since the erase voltage is first increased (block 1000b) (t1 in FIG. 14A). See the voltage detector 784 in FIGS. 8A and 8B.

If decision step 1000 is false, step 999 continues to ramp up the erase voltage. If decision step 1000 is true, step 1000c involves allowing control gate voltages of SGS transistors to float (t3 in FIG. 14D) and holding the erase voltage at V1. A decision step 1001 determines whether the channel region of the SGD transistors is charged to Vref (t4 in FIG. 14A). This is a level which is sufficiently high to avoid disturbs of the SGD transistors but not so high as to erase the SGD transistors. This decision step may be true if Vbl (a bit line voltage) is detected to exceed Vref (block 1001a) or a specified time passes since Vsubstrate is detected to exceed V1 (block 1001b). Steps 1001a and 1001b are examples of adaptively initiate floating of the control gate voltages of the drain end select gate transistors based on monitoring of the charging up of the channel.

If decision step 1001 is false, step 1002 maintains the erase voltage at the first level and the voltages of the SGD transistors and the word lines at respective fixed levels. A loop occurs from step 1001 and 1002 until decision step 1001 is true, at which time step 1003 is reached. This is t4 in FIG. 14A, for example. If decision step 1001 is true, step 1003 includes increasing the erase voltage from the first level to a second level (V2, e.g., 20-25 V), allowing control gate voltages of the SGD transistors to float, and holding control gate voltages of the word lines at a fixed level. See time period t4-t9 in FIG. 14A to 14D. After the erase voltage has been at V2 for a specified time, or after a specified time has passed since the start of the ramping of the erase voltage, step 1004 ramps down the erase voltage and sets the control gate voltages of the SGD and SGS transistors to a fixed level, e.g., 0 V. See time period t9-t10 in FIG. 14A to 14D.

Step 1005 includes performing an erase verify test for a block. Typically, this involves setting an erase verify voltage VvEr (FIG. 11A) to the word lines while sensing a current in the memory strings. If the current is sufficiently high, the string is considered to pass the verify test. The block in turn passes the verify test if all, or nearly all of the strings pass the verify test. If the block passes the erase verify test (decision step 1006 is true), the erase operation is completed, at step 1008. If the block does not pass the erase verify test (decision step 1006 is false), the erase voltage is incremented at step 1007 and a next erase loop occurs at step 999. An erase loop typically involves applying erase voltages followed by performing a verify test, although in some cases the verify test is omitted.

The erase operation advantageously sets the optimum time for floating the SGD control gate voltages, where this time can vary due to factors such as fabrication variations, degree of programming of a block, block position and temperature.

Figure 11A:
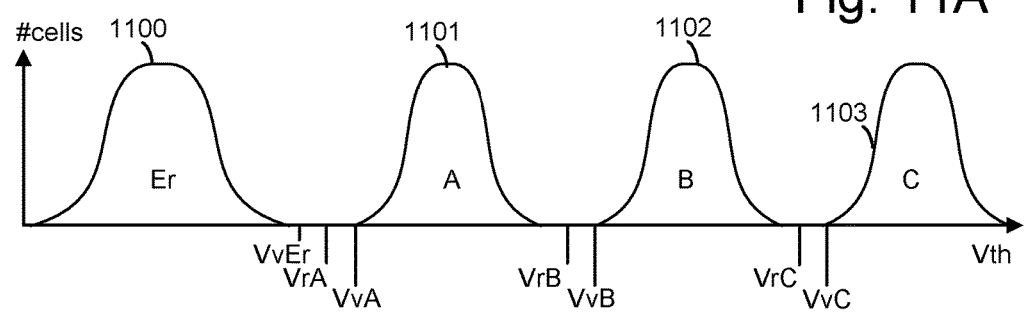
FIG. 11A depicts an example threshold voltage (Vth) distribution of a set of memory cells connected to a word line, after a programming operation, where four data states are used.

FIG. 11A depicts an example threshold voltage (Vth) distribution of a set of memory cells connected to a word line, after a programming operation, where four data states are used. A Vth distribution 1100 is provided for erased (Er) state memory cells. Three Vth distributions 1101, 1102 and 1103 represent assigned data states A, B and C, respectively, which are reached by memory cells when their Vth exceeds the erase-verify voltage VvA, VvB or VvC, respectively. This example uses four data states. Other numbers of data states can be used as well, such as eight or sixteen. Read voltages VrA, VrB and VrC are used to read data from a set of cells having this Vth distribution. An erase verify voltage VvEr is used in an erase-verify test to determine whether the erase operation is completed.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Figure 11B:
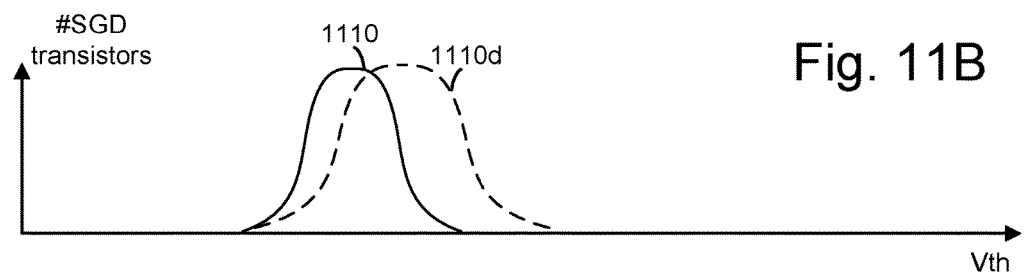
FIG. 11B depicts an example Vth distribution of a set of SGD transistors with and without a disturb.

FIG. 11B depicts an example Vth distribution of a set of SGD transistors with and without a disturb. Plot 1110 depicts the case of no disturb, and this may represent a set of SGD transistors in a fresh memory device. Plot 1110d depicts the case of a disturb (Vth increase), and this may represent a set of SGD transistors in a cycled memory device. In stacked 3D memory devices, the disturb increases as program-erase cycles are performed. It has been found that this SGD occurs during an erase operation, and is more severe when a bias on the SGD gate is directly applied.

Figure 12:
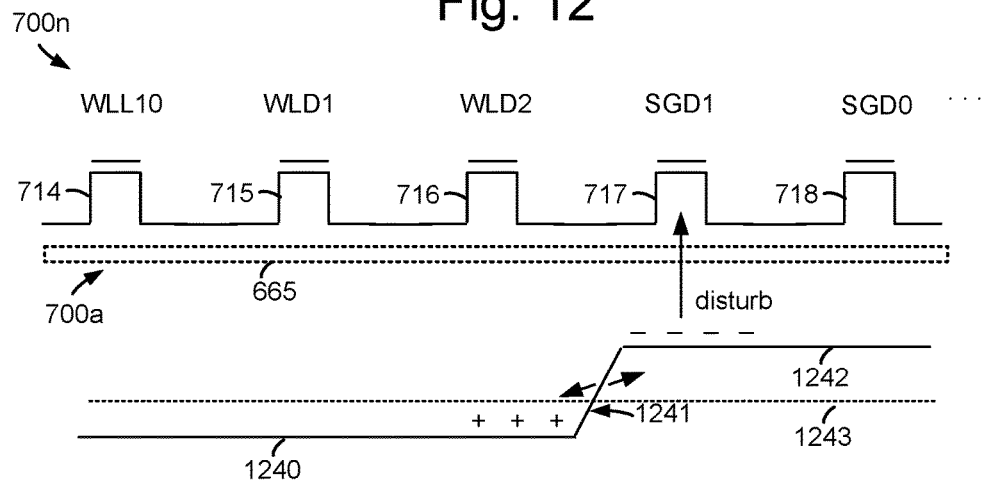
FIG. 12 depicts a plot of a channel voltage versus memory string position during an erase operation, showing a channel gradient which causes a disturb in an SGD transistor.

FIG. 12 depicts a plot of a channel voltage versus memory string position during an erase operation, showing a channel gradient which causes a disturb in an SGD transistor. A portion of the memory string 700n and its channel 700a of FIG. 7 is depicted. The string 700n includes a data memory cell 714 connected to WLL10, dummy memory cells 715 and 716 connected to WLD1 and WLD2, respectively, and SGD transistors 717 and 718 connected to SGD1 and SGD0, respectively. Plots 1240, 1241 and 1242 represent a voltage along the length of the channel. In this example, a low control gate voltage such as 0-2 V is applied to the transistors 714-716. If we assume the erase voltage has just been applied to the substrate, the channel voltage adjacent to the transistors 714-716 will be low, e.g., about 0 V as depicted by the plot 1240. The channel voltage is low because the portion of the channel adjacent to the SGD transistor has not yet been charged up and very few carriers exist inside the channel.

If a significant bias such as 10-12 V is applied to an SGD transistor, this couples up the channel to a higher level as represented by plot 1242. As a result, there is a significant channel gradient between the transistors 716 and 717 as represented by the plot 1241. The channel gradient generates electron-hole pairs in the channel. The electrons can be accelerated and injected into the charge trapping layer of the SGD transistor 717, causing a disturb. Example electrons are denoted by "−" and holes are denoted by "+".

In another option, the control gate voltage of the SGD transistor is floated when the erase voltage is initially applied to the substrate. However, this can also result in a disturb. In particular, if the control gate voltage of the SGD transistors is allowed to float when the erase voltage is initially applied, there can be a capacitive coupling up of the control gate voltage from the local interconnect (LI) which carries the erase voltage. This coupling occurs because the LI 617 runs adjacent to the conductive layers of the SGD layers SGD0 and SGD1, as depicted in FIG. 4.

Generally, a channel gradient occurs if the SGD control gate is driven or floated at a sufficiently high voltage, while the adjacent word line is driven at a low voltage and while an adjacent channel regions is poorly boosted. A gradient thus occurs if the SGD control gate is floated too soon during an erase voltage which is applied to the substrate, or during another source of capacitive coupling.

A plot 1243 represent the channel voltage adjacent to the SGD transistor 717 when the SGD control gate is floated at an optimum time using the techniques described herein. In this case, a channel gradient and the associated disturb are avoided. The channel voltage of the plot 1243 is higher than the voltage of plot 1240.

Figure 13A:
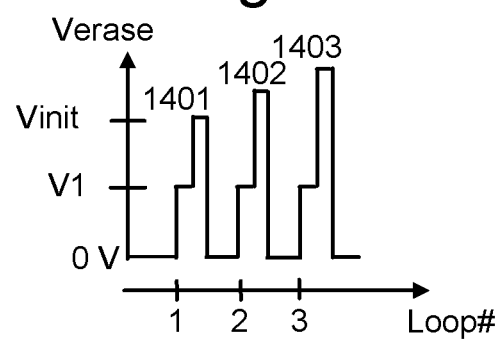
FIG. 13A depicts a plot of example erase voltages applied to a substrate in an erase operation consistent with FIG. 10.

FIG. 13A depicts a plot of example erase voltages applied to a substrate in an erase operation consistent with FIG. 10. The vertical axis depicts Verase and the horizontal axis depicts the erase loop number. Verase has an initial magnitude of Vinit and steps up in magnitude in each successive erase loop. A total of three loops are used to complete the erase operation in this example. Erase voltages 1401, 1402 and 1403 are applied in the erase loops 1, 2 and 3, respectively. Verase is the voltage applied to the substrate via the local interconnect.

Figure 13B:
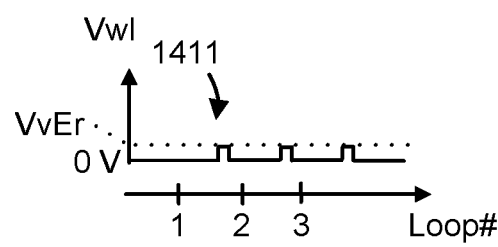
FIG. 13B depicts a plot of verify voltages applied to word lines in a block, consistent with the example of FIG. 13A.

FIG. 13B depicts a plot of verify voltages applied to word lines in a block, consistent with the example of FIG. 13A. The vertical axis depicts Vwl (word line voltage) and the horizontal axis depicts the erase loop number. An example erase verify voltage 1411 is depicted. This voltage (VvEr)

may have a magnitude near 0 V, for example. An erase verify voltage is typically applied after each erase voltage as part of an erase verify test of a block.

FIG. 14A depicts an example erase voltage waveform 1400, also showing substrate and bit line voltages, consistent with FIG. 10. The erase voltage applied to the local interconnect and the substrate is represents by plots 1420a, 1420d, 1420e, 1420h and 1420i. The erase voltage is initially increased to, and held at, a first level V1, then increased to, and held at, a second level V2. The voltage of the source end of the channels of the memory strings, is represented by plots 1420c and 1420f along with the other plots. The voltage at the source end follows Vsubstrate but is delayed by a relatively small amount. The bit line voltage, corresponding to the voltage of the drain end of the channels of the memory strings, is represented by plots 1420b and 1420g along with the other plots. The drain ends of the channels take more time to charge up than the source ends of the channels.

The plots thus show that more time is needed to charge up the drain end of the channel than the source end of the channel. The voltages of the source and drain ends of the channel reach Vref at t3 and t4, respectively. Vref can be set at or slightly below V1, in one approach. For example, with V1=10 V, Vref can be 8 V. By setting Vref to be slightly below V1, delays in the erase operation are reduced since Vref<V1 can be reached sooner than Vref=V1.

FIG. 14B depicts an example SGD control gate voltage waveform 1410, consistent with FIG. 14A. The control gate voltage is driven at a low voltage such as 0 V from W44. At t4, in response to Vbl (plot 1420b) reaching Vref, the control gate voltage of the SGD transistors is floated, e.g., by disconnecting the control gate from a voltage source. As the drain end of the channel is charged up, the control gate voltage of the SGD transistors (Vsgd) increases due to capacitive coupling from the channel and the local interconnect. Vsgd may reach a maximum level similar to V2 between t7-t9.

FIG. 14C depicts an example data word line and dummy word line voltage waveform 1420, consistent with FIGS. 14A and 14B. The word lines may be held at a low level such as 0-2 V, for instance. This allows a large channel-to-gate voltage to be developed which erases the cells as the channel is charged up.

FIG. 14D depicts an example SGS control gate voltage waveform 1430, consistent with FIG. 14A to 14C. In one option, a coupling erase is performed in which the SGS control gate voltage is treated similarly to the SGD control gate voltage. In particular, the SGS control gate voltage can be floated when the voltage of the source end of the channel, as depicted by plots 1420c in FIG. 14A, reaches V1.

From t0 to t3, the control gate voltage is set to 0 V. At this time, if we assume the SGS transistors have a Vth of 1 V, Vsgd−Vs<Vth is met (where Vsgd is the SGS control gate voltage and Vs is the source or substrate voltage) so that hole current can flow in to the channel to charge up the channel. Since SGS is at the source end of the channel, the channel region adjacent to the SGS transistor will have a similar voltage as the substrate. We can therefore directly detect the substrate voltage to determine when it reaches a reference voltage such as 8 V and, based on this detection, start floating the SGS control gate voltage, in one possible approach. The SGS control gate voltage can float up to a level which is comparable to V2.

The SGS control gate voltage is thus driven from t0-t3, floated from t3-t9, and driven back to 0 V at t9.

In another possible approach, the SGS control gate voltage is floated after a specified time period has elapsed since the erase voltage was initially applied to the substrate rather than based on a voltage detection. This avoids the need for a voltage detector connected to the substrate. In another possible option, the SGS control gate voltage is driven throughout the duration of the erase voltage rather than being floated. However, this consumes additional power compared to floating.

The main cause of SGD disturb is the channel potential difference under SGD and its neighboring dummy WL which is caused by slow channel charging compared with source line charging. A coupling erase operation which minimizes this channel potential difference involves detecting the substrate voltage when the erase voltage is applied to the local interconnect. When the substrate voltage reaches V1, the ramping stops and the erase voltage can be held at V1 until the charging of the channel can catch up with the charging of the substrate. Subsequently, the erase voltage can be increased further, e.g., to the second level V2, and the SGD control gate voltage can be floated so that it is coupled up by the channel and the erase voltage on the local interconnect. Different approaches can be used for determining how long to wait before the erase voltage continues ramping. One approach involves waiting for a fixed amount of time after the substrate voltage first reaches V1, e.g., t4-t2 in FIG. 14A, where this time can be adjusted through a device operation parameter. Another approach involves waiting for a fixed amount of time after the erase voltage is initially applied, e.g., t4-t1 in FIG. 14A.

Another approach detects when the bit line voltage, which is floating when the erase voltage is applied, exceeds Vref. Since the floating bit lines are charged up together with the channels, the bit line voltage is very close to the voltage of a drain end of the channel. The bit line voltage can therefore provide accurate information on the channel voltage which is more relevant than Vsubstrate, and use this information to prevent SGD disturb.

Figure 15:
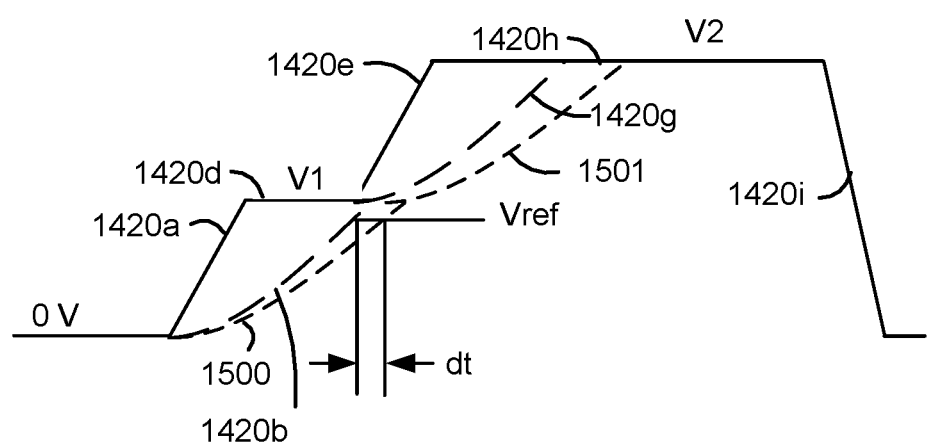
FIG. 15 depicts an example erase voltage waveform, also showing substrate and bit line voltages as a function of block position, consistent with FIG. 10.

FIG. 15 depicts an example erase voltage waveform, also showing substrate and bit line voltages as a function of block position, consistent with FIG. 10. When a voltage detector is connected to a bit line to determine an optimum time to begin floating the SGD transistor control gate voltage, the detected voltage can vary based on the distance of the block from the voltage detector. As the distance becomes greater, there will be a greater delay in detecting when Vbl reaches Vref. For example, the plots 1420b and 1420g represent the voltages of a block which is relatively close to the voltage detector (such as BLK_0 at a distance d1 in FIG. 16) and the plots 1500 and 1501 represent the voltages of a block which is relatively far from the voltage detector (such as BLK_8 at a distance d2 in FIG. 16). The close and far blocks reach Vref at different times as represented by the time difference dt.

To ensure that the channel voltage is uniformly detected, one option is to set Vref lower for the far blocks, e.g., Vref is inversely proportional to the distance of the block from the voltage detector. Another option is to impose a delay after the detected voltage reaches Vref for the close blocks but not for the far blocks, before allowing the SGD control gate voltages to float. Or, a larger delay can be imposed for the close blocks compared to a delay imposed for the near blocks. The delay can be inversely proportional to the distance.

Figure 16:
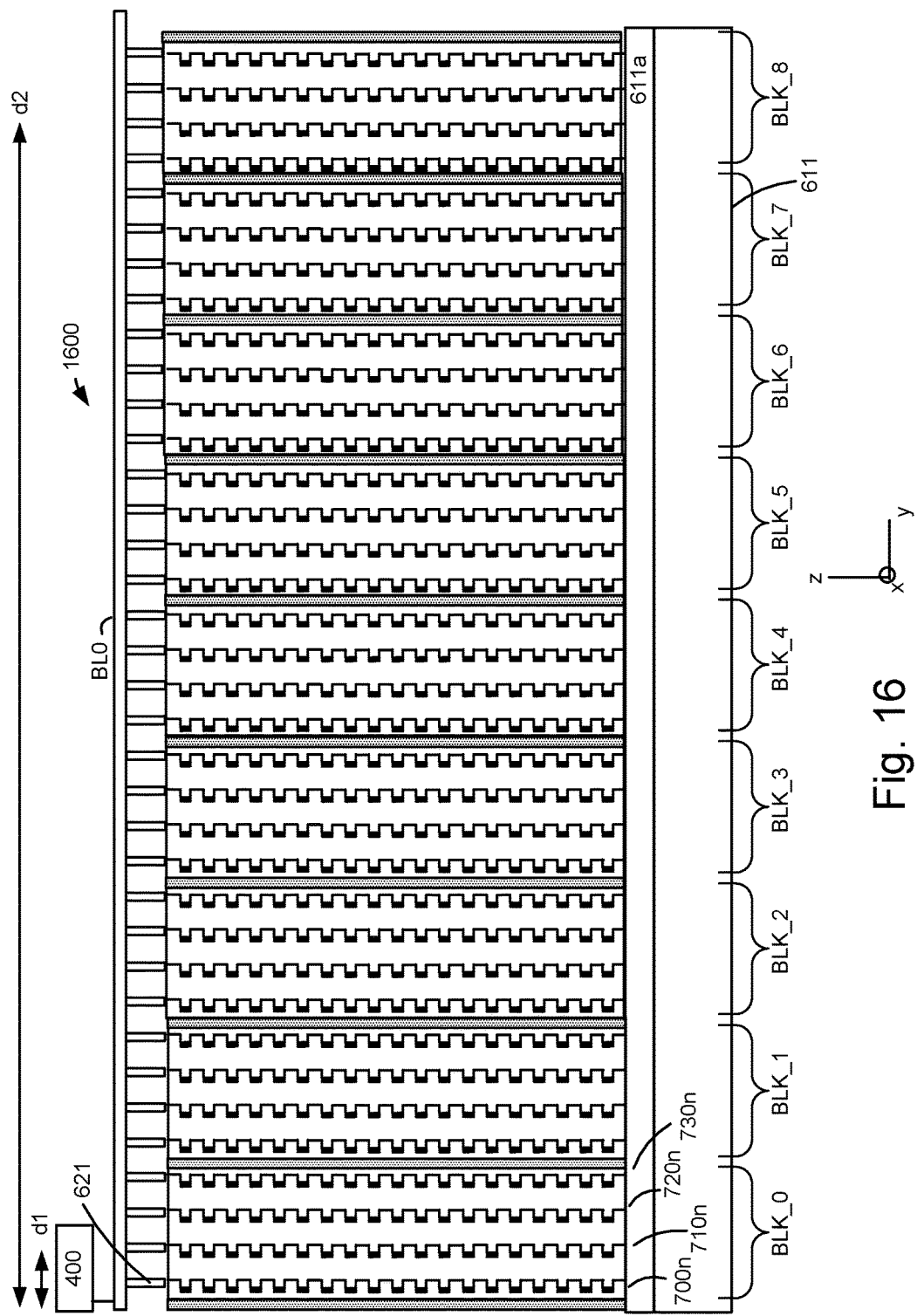
FIG. 16 depicts a set of blocks at different distances from a voltage detector.

FIG. 16 depicts a set of blocks at different distances from a voltage detector. A memory device 1600 includes a set of blocks BLK_0 to BLK_8, consistent with FIG. 21. BLK_0 is consistent with FIG. 7 and includes memory strings 700n, 710n, 720n and 730n. An example bit line BL0 is connected to a set of strings in each block using conductive vias such as example via 621, consistent with FIGS. 4 and 7. A voltage detector 400 is connected to BL0, consistent with FIGS. 4 and 7. The blocks are arranged on a diffusion region 611a of a substrate 611, consistent with FIG. 4. The voltage detector is at one end of the bit line in this example. In another approach, the voltage detector is partway between the far ends of the bit line.

Figure 17:
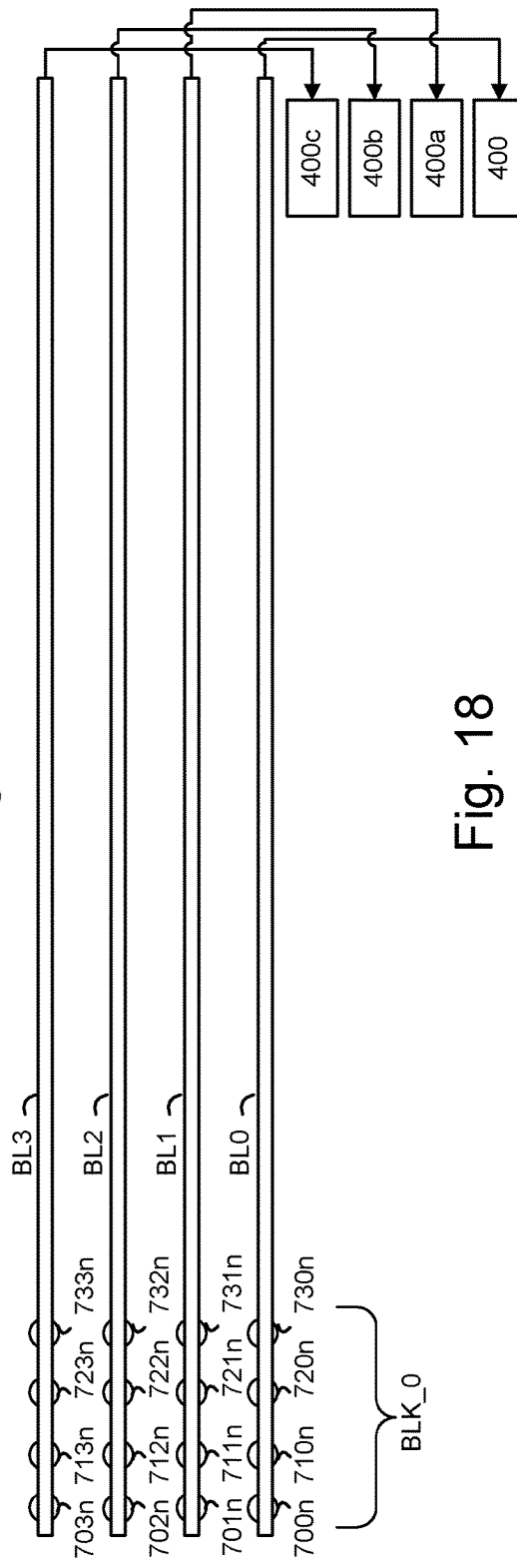
FIG. 17 depicts one example of a top view of the bit lines of FIG. 16, where each bit line has a separate voltage detector.

FIG. 17 depicts one example of a top view of the bit lines of FIG. 16, where each bit line has a separate voltage detector. The bit line BL0 is repeated along with the bit lines BL1, BL2 and BL3, consistent with FIG. 8A. The bit lines BL0, BL1, BL2 and BL3 are connected to respective voltage detectors 400, 400a, 400b and 400c, respectively. In one approach, each bit line is connected to multiple strings in a block. For example, BLK_0 of FIG. 8A with its NAND strings is depicted. BL0 is connected to NAND strings 700n, 710n, 720n and 730n, BL1 is connected to NAND strings 701n, 711n, 721n and 731n, BL2 is connected to NAND strings 702n, 712n, 722n and 732n, and BL3 is connected to NAND strings 703n, 713n, 723n and 733n.

As a result, the voltage on the bit line will be based on the voltages in the channels of each of the multiple strings to which the bit line is connected. The voltage on the bit line may be based on the highest channel voltage among the multiple strings connected to the bit line. For example, the voltage on BL0 may be based on the highest channel voltage among the NAND strings 700n, 710n, 720n and 730n. The detected voltages may vary on the different bit lines. One approach is to require that all bit lines reach Vref before floating the SGD control gate voltages in a block and increasing the erase voltage to the second level. This ensures that the slowest charging channels have been charged up to Vref. Another approach is to require only one of the bit lines to reach Vref before floating the SGD control gate voltages and increasing the erase voltage to the second level. This allows the erase voltage to be increased to the second level sooner so that the erase pulse time is reduced. A compromise approach is to require a specified portion of the bit lines to reach Vref before floating the SGD control gate voltages and increasing the erase voltage to the second level.

Figure 18:
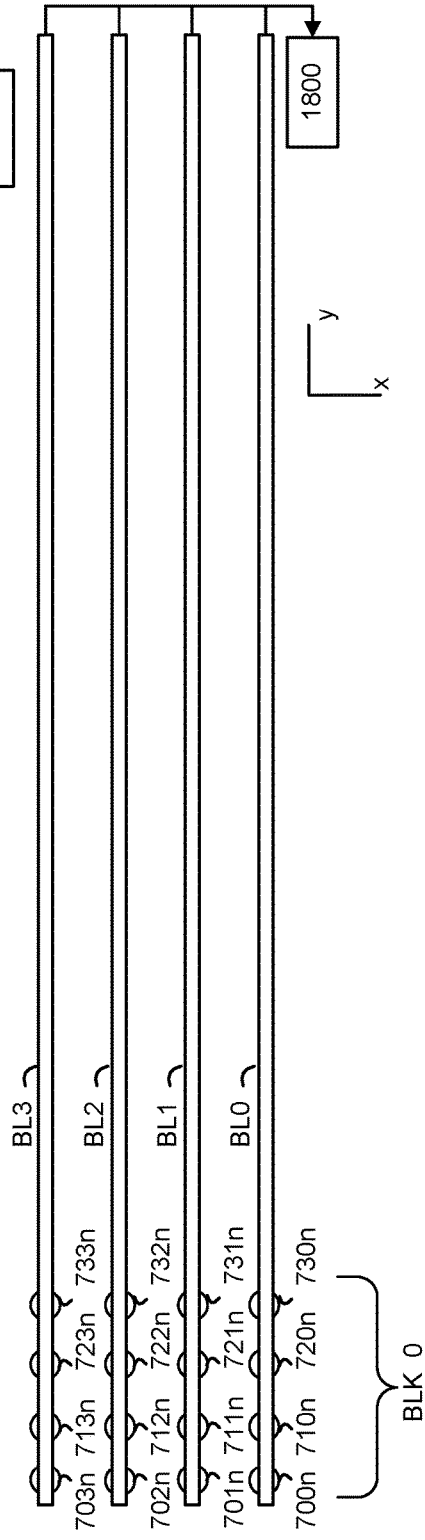
FIG. 18 depicts another example of a top view of the bit lines of FIG. 16, where the bit lines have a common voltage detector.

FIG. 18 depicts another example of a top view of the bit lines of FIG. 16, where the bit lines have a common voltage detector 1800. This approach avoids the need for separate detectors but involves circuitry which connects the bit lines during an erase operation while disconnecting them at other times such as during read and program operations. The sensed voltage will reach Vref based on the fastest charging channel of the NAND strings in the block.

Figure 19:
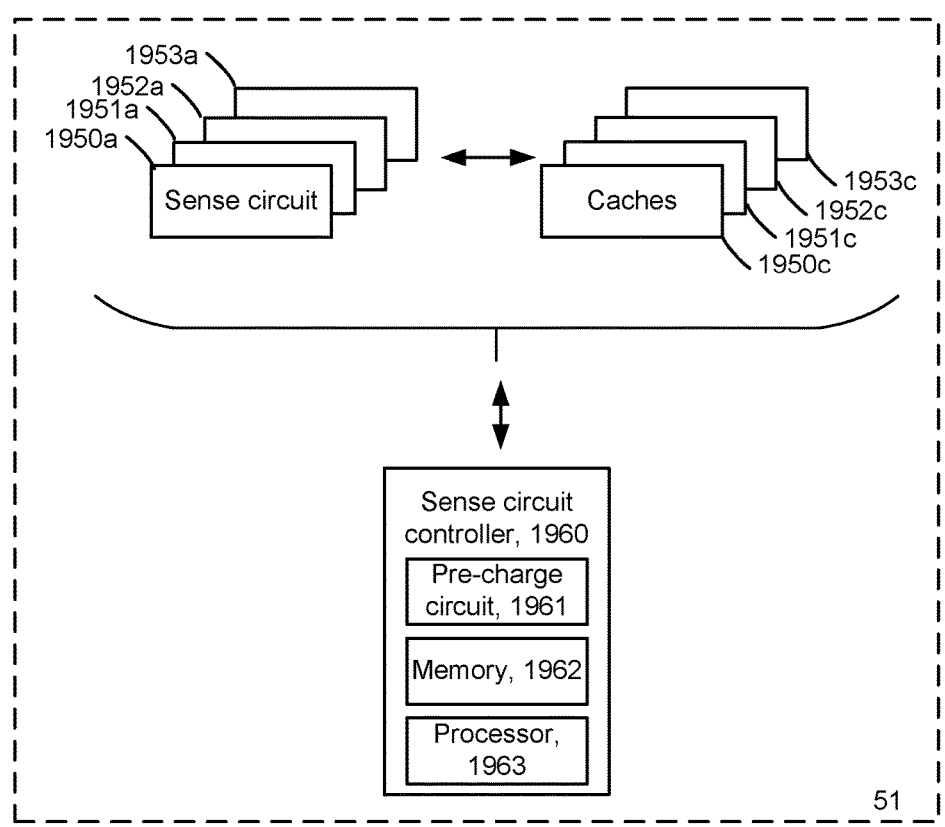
FIG. 19 depicts an example block diagram of a sense block 51 in the column control circuitry of FIG. 1.

FIG. 19 depicts an example block diagram of a sense block 51 in the column control circuitry of FIG. 1. The column control circuitry can include multiple sense blocks, where each sense block performs sensing, e.g., read, program verify or erase verify operations for multiple memory cells via respective bit lines.

In one approach, a sense block comprises multiple sense circuits, also referred to as sense amplifiers. Each sense circuit is associated with data latches and caches. For example, the example sense circuits 1950a, 1951a, 1952a and 1953a are associated with caches 1950c, 1951c, 1952c and 1953c, respectively.

In one approach, different subsets of bit lines can be sensed using different respective sense blocks. This allows the processing load which is associated with the sense circuits to be divided up and handled by a respective processor in each sense block. For example, a sense circuit controller 1960 can communicate with the set, e.g., sixteen, of sense circuits and latches. The sense circuit controller may include a pre-charge circuit 1961 which provides a voltage to each sense circuit for setting a pre-charge voltage. The sense circuit controller may also include a memory 1962 and a processor 1963.

Further example details of the sense circuit controller and the sense circuits are provided below.

Figure 20:
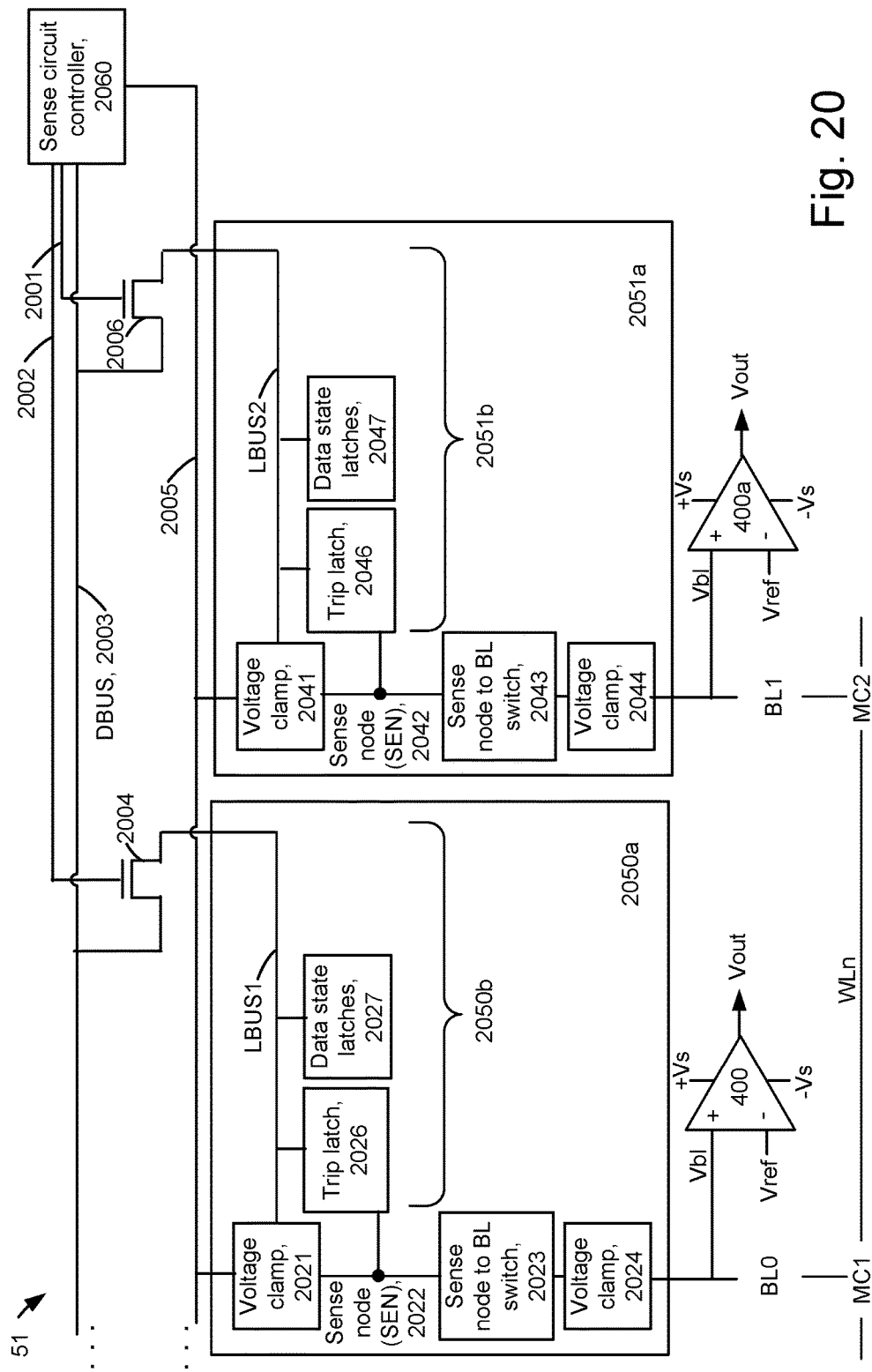
FIG. 20 depicts another example block diagram of a sense block 51 in the column control circuitry of FIG. 1.

FIG. 20 depicts another example block diagram of a sense block 51 in the column control circuitry of FIG. 1. The sense circuit controller 2060 communicates with multiple sense circuits including example sense circuits 2050a and 2051a. The sense circuit 2050a includes latches 2050b, including a trip latch 2026 and data state latches 2027. During a program operation, the data state latches may store the data which identifies the assigned data state of cells MC1 and MC2, which are connected to the bit lines BL0 and BL1, respectively. In case of a failure in programming data to cells of a word line, this data can be read and stored in another block, as discussed.

The sense circuit further includes a voltage clamp 2021 such as a transistor which sets a pre-charge voltage at a sense node 2022 (SEN). A sense node-to-bit line (BL) switch 2023 selectively allows the sense node to communicate with a bit line BL0, e.g., the sense node is electrically connected to the bit line so that the sense node voltage can decay. BL0 is connected to one or more memory cells, such as a memory cell MC1. A voltage clamp 2024 can set a voltage on the bit line, such as during a sensing operation or during a program voltage. A local bus, LBUS1, allows the sense circuit controller to communicate with components in the sense circuit, such as the latches 2050b and the voltage clamp in some cases. To communicate with the sense circuit 2050a, the sense circuit controller provides a voltage via a line 2002 to a transistor 2004 to connect LBUS1 with a data bus DBUS, 2003. The communicating can include sending data to the sense circuit and/or receive data from the sense circuit.

The sense circuit controller can communicate with different sense circuits in a time-multiplexed manner, for instance. A line 2005 may be connected to the voltage clamp in each sense circuit, in one approach.

The sense circuit 2051a includes latches 2051b, including a trip latch 2046 and data state latches 2047. A voltage clamp 2041 may be used to set a pre-charge voltage at a sense node 2042 (SEN). A sense node-to-bit line (BL) switch 2043 selectively allows the sense node to communicate with a bit line BL1, and a voltage clamp 2044 can set a voltage on the bit line. BL1 is connected to one or more memory cells such as a memory cell MC2. A local bus, LBUS2, allows the sense circuit controller to communicate with components in the sense circuit, such as the latches 2051b and the voltage clamp in some cases. To communicate with the sense circuit 2051a, the sense circuit controller provides a voltage via a line 2001 to a transistor 2006 to connect LBUS2 with DBUS. The lines 2001 and 2002 can be considered to be sense amplifier control lines.

The example memory cells MC1 and MC2 are connected to a selected word line WLn.

A cache may be associated with each sense circuit and connected to DBUS.

During an erase operation, the trip latches may store data which results from the erase verify test of the respective string of memory cells.

The circuit also includes voltage detectors 400 and 400a connected to BL0 and BL1, respectively. Each voltage detector may comprise an operational amplifier comparator, for instance. The comparator includes a non-inverting input which receives Vbl, an inverting input which receives Vref, positive and negative power supplies +Vs and −Vs, respectively and an output which provides Vout. Vout=+Vs if Vbl>Vref and Vout=−Vs if Vbl<Vref. The analog output value can be provided to a controller (e.g., controller 122) or control circuitry 110 which converts it to a 0 or 1 bit to represent Vbl>Vref or Vbl<Vref, respectively. If the bit=0, the controller can initiate floating of the SGD control gate voltage. The erase voltage can also increase from the first level to the second level in a second step. It is also possible for the floating of the SGD control gate voltage and the second step increase in the erase voltage to begin at different times.

Figure 21:
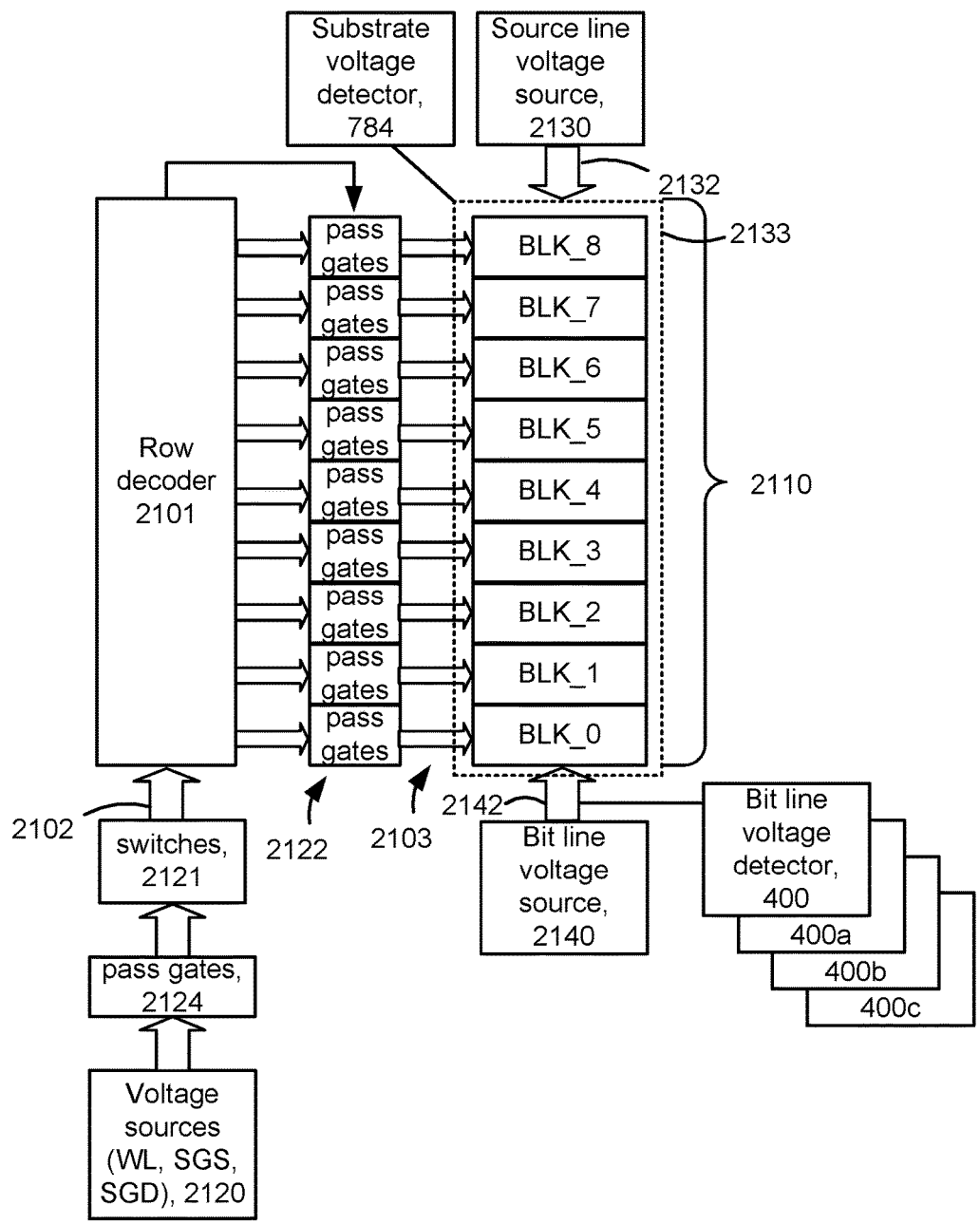
FIG. 21 depicts an example circuit for providing voltages to blocks of memory cells.

FIG. 21 depicts an example circuit for providing voltages to blocks of memory cells. In this example, a row decoder 2101 provides voltages to word lines and select gates of each block in set of blocks 2110. The set could be in a plane and includes blocks BLK_0 to BLK_8, consistent with FIG. 9B. The row decoder provides a control signal to pass gates 2122 which connect the blocks to the row decoder. Typically, operations, e.g., program, read or erase, are performed on one selected block at a time. The row decoder can connect global control lines 2102 to local control lines 2103. The control lines represent conductive paths. Voltages are provided on the global control lines from voltage sources 2120. The voltage sources may provide voltages to switches 2121 which connect to the global control lines. Pass gates 2124, also referred to as pass transistors or transfer transistors, are controlled to pass voltages from the voltage sources 2120 to the switches 2121.

The voltage sources 2120 can provided voltages on word lines (WL), SGS control gates and SGD control gates, for example.

During an erase operation for a block, 0 V may be provided on the global control lines which are connected to the local word lines of a selected block which is to be erased. An erase voltage, Verase, e.g., up to 20-25 V. may be provided on global control line which is connected to the local source line of the selected block, in one approach while control lines for the SGD control gates may float, for instance, at an optimum time as discussed. During an erase verify operation, a verify voltage may be provided on global control lines which are connected to the local word lines of a selected block.

The various components, including the row decoder, may receive commands from a controller such as the state machine 112 or the controller 122 to perform the functions described herein.

A source line voltage source 2130 provides the erase voltage to the source lines/diffusion region in the substrate via control lines 2132. In one approach, the source diffusion region 2133 is common to the blocks. A set of bit lines 2142 is also shared by the blocks. A bit line voltage source 2140 provides voltages to the bit lines. In one possible implementation, the voltage sources 2120 are near the bit line voltage source.

A substrate voltage detector 784 consistent with FIGS. 8A and 8B is connected to the diffusion region 2133. A set of one or more bit line voltage detectors 400, 400*a*, 400*b* and 400*c* consistent with FIG. 17 are connected to the set of bit lines 2142.

In one implementation, an apparatus comprises: a block of memory cells, the memory cells are arranged in a plurality of strings, each string comprising a source end connected to a substrate, a drain end, a channel extending between the source end and the drain end, and a drain end select gate transistor; and a control circuit. The control circuit, to perform an erase operation for the block, is configured to: apply a voltage to the substrate to charge up the channel, the voltage applied to the substrate is increased to, and held at, a first level; hold control gate voltages of the drain end select gate transistors at a fixed level while the voltage applied to the substrate is increased to, and held at, the first level; increase the voltage applied to the substrate to a second level, higher than the first level, and hold the voltage applied to the substrate at the second level; and adaptively initiate floating of the control gate voltages of the drain end select gate transistors based on monitoring of the charging up of the channel.

In another implementation, a method comprises: charging up channels of memory strings from one end of each memory string, each memory string comprising a select gate transistor and one or more memory cells; and during the charging up of the channels of the memory strings, monitoring a voltage of a control line connected to another end of each memory string and, when the voltage of the control line reaches a reference voltage, transitioning from driving control gate voltages of the select gate transistors to floating the control gate voltages of the select gate transistors.

In another implementation, an apparatus comprises: a block of memory cells, the memory cells are arranged in a plurality of sets, each set comprising a source end, a drain end, and a drain end select gate transistor; control lines connected to the drain ends; means for detecting a voltage at one or more of the control lines during an erase operation for the block of memory cells; and means for initiating floating of control gate voltages of the drain end select gate transistor based on the mean for detecting.

The means described above can include the components of the memory device 100 of FIG. 1 and FIG. 2, for example. The power control module 116, for instance, controls the power and voltages supplied to the word lines, select gate lines and bit lines during memory operations. Moreover, the means described above can include the components of FIG. 17 including the decoders, voltage drivers, switches and pass transistors. The means can further include any of the control circuits in FIGS. 1 and 2 such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
    a block of memory cells, the memory cells are arranged in a plurality of strings, each string comprising a source end connected to a substrate, a drain end, a channel extending between the source end and the drain end, and a drain end select gate transistor; and
    a control circuit, the control circuit, to perform an erase operation for the block, is configured to:
        apply a voltage to the substrate to charge up the channel, the voltage applied to the substrate is increased to, and held at, a first level;

hold control gate voltages of the drain end select gate transistors at a fixed level while the voltage applied to the substrate is increased to, and held at, the first level;

increase the voltage applied to the substrate to a second level, higher than the first level, and hold the voltage applied to the substrate at the second level; and adaptively begin floating of the control gate voltages of the drain end select gate transistors based on monitoring of the charging up of the channel.

2. The apparatus of claim 1, further comprising:
a plurality of bit lines connected to the drain ends; and
a voltage detector connected to a bit line of the plurality of bit lines, wherein the control circuit is configured to begin to float the control gate voltages of the drain end select gate transistors based on when the voltage detector indicates that a voltage of the bit line exceeds a reference voltage.

3. The apparatus of claim 2, wherein:
the block of memory cells is among multiple blocks which are arranged at different distances from the voltage detector;
the plurality of bits lines are connected to drain ends of strings of memory cells in each of the multiple blocks; and
the control circuit is configured to begin the floating based on when the voltage detector indicates that the voltage of the bit line exceeds the reference voltage and to adjust the reference voltage based on a distance between the block of memory cells and the voltage detector.

4. The apparatus of claim 2, wherein:
the voltage detector is among multiple voltage detectors, each of the multiple voltage detectors is connected to a respective bit line of the plurality of bit lines; and
the control circuit is configured to begin the floating based on when all of the multiple voltage detectors indicate that a voltage of the respective bit line exceeds the reference voltage.

5. The apparatus of claim 2, wherein:
the voltage detector is among multiple voltage detectors;
each of the multiple voltage detectors is connected to a respective bit line of the plurality of bit lines; and
the control circuit is configured to begin the floating based on when at least a specified portion of the multiple voltage detectors indicate that a voltage of the respective bit line exceeds the reference voltage.

6. The apparatus of claim 2, wherein:
the voltage detector is connected to multiple bit lines of the plurality of bit lines.

7. The apparatus of claim 2, wherein:
the bit line to which the voltage detector is connected is in turn connected to the drain ends of multiple strings among the plurality of strings.

8. The apparatus of claim 2, wherein:
the control circuit is configured to begin to increase the voltage applied to the substrate to the second level based on when the voltage detector indicates that the voltage of the bit line exceeds the reference voltage.

9. The apparatus of claim 1, wherein:
the strings extend vertically in a stack;
the stack comprising conductive layers which alternate with dielectric layers;
the control gate voltages of the drain end select gate transistors are provided via one of the conductive layers;
the source ends are connected to the substrate;
a local interconnect is connected to the substrate and extends vertically through the stack; and
the voltage applied to the substrate is applied via the local interconnect.

10. The apparatus of claim 1, wherein:
each string comprises a data or dummy memory cell adjacent to the drain end select gate transistor, and the control circuit is configured to bias the data or dummy memory cells during the applying of the voltage to the substrate.

11. The apparatus of claim 1, further comprising:
a voltage detector connected to the substrate, wherein the control circuit is configured to begin the floating of the control gate voltages of the drain end select gate transistors based on when the voltage detector indicates that a voltage of the substrate exceeds a reference voltage followed by a time delay.

12. The apparatus of claim 11, further comprising:
a voltage detector connected to the substrate, wherein the control circuit is configured to hold the voltage applied to the substrate at the first level based on when the voltage detector connected to the substrate detects that the voltage of the substrate reaches the first level.

13. The apparatus of claim 1, further comprising:
a voltage detector connected to the substrate, wherein the control circuit is configured to begin to increase the voltage applied to the substrate to the second level based on when the voltage detector connected to the substrate detects that the voltage of the substrate reaches the first level followed by a time delay.

14. A method for erasing memory cells, comprising:
charging up channels of memory strings from one end of each memory string, each memory string comprising a select gate transistor and one or more memory cells; and
during the charging up of the channels of the memory strings, monitoring a voltage of a control line connected to another end of each memory string and, when the voltage of the control line reaches a reference voltage, transitioning from driving control gate voltages of the select gate transistors to floating the control gate voltages of the select gate transistors.

15. The method of claim 14, wherein:
the one end of each memory string is connected to a substrate;
a local interconnect is connected to the substrate; and
the charging up of the channels of the memory strings comprises applying a voltage to the local interconnect at a first level until the voltage of the control line reaches the reference voltage, then applying a voltage to the local interconnect at a second level, higher than the first level.

16. The method of claim 14, wherein:
the charging up of the channels of the memory strings, the monitoring the voltage of the control line and the transitioning from driving the control gate voltages of the select gate transistors to floating the control gate voltages of the select gate transistors, occur in each erase loop of a plurality of erase loops of an erase operation.

17. The method of claim 16, wherein:
in each erase loop, the charging up of the channels of the memory strings comprises applying a voltage to a substrate at a first level until the voltage of the control line reaches the reference voltage, then applying a voltage to the substrate at a second level, higher than the first level; and the one end of each memory string is connected to the substrate.

18. An apparatus, comprising:

a block of memory cells, the memory cells are arranged in a plurality of sets, each set comprising a source end, a drain end, and a drain end select gate transistor;

control lines connected to the drain ends;

means for ramping up an erase voltage at the source ends during an erase operation for the block of memory cells;

means for detecting a voltage at one or more of the control lines during the ramping up of the erase voltage; and means for transitioning from driving control gate voltages of the drain end select gate transistors to floating of the control gate voltages of the drain end select gate transistors based on the mean for detecting.

19. The apparatus of claim 18, wherein:

the source ends are connected to a substrate;

a local interconnect is connected to the substrate; and the means for applying the voltage to the source ends comprises means for applying the voltage to the local interconnect.

20. The apparatus of claim 18, wherein:

the means for transitioning initiates floating of the control gate voltages of the select gate transistors when the voltage at the one or more of the control lines reaches a reference voltage.

* * * * *